(12) United States Patent
Pan

(10) Patent No.: US 6,786,319 B2
(45) Date of Patent: Sep. 7, 2004

(54) BELT CONVEYER WITH POWER CONDUCTION FOR ELECTRICAL TEST

(75) Inventor: Robert Pan, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 10/443,014

(22) Filed: May 22, 2003

(65) Prior Publication Data

US 2004/0050656 A1 Mar. 18, 2004

(30) Foreign Application Priority Data

Aug. 30, 2002 (TW) ........................... 91213654 U

(51) Int. Cl.⁷ .................. B21B 39/00; B23B 13/00; B23D 47/04; B23Q 5/22; B23Q 7/00
(52) U.S. Cl. ..................... 198/339.1; 224/202
(58) Field of Search ............... 198/339.1, 691, 198/810.02, 810.03; 204/202; 224 R

(56) References Cited

U.S. PATENT DOCUMENTS

| | | | | |
|---|---|---|---|---|
| 3,904,489 A | * | 9/1975 | Johnson | 204/202 |
| 3,966,581 A | * | 6/1976 | Holte | 204/202 |
| 4,508,611 A | * | 4/1985 | Johnson et al. | 204/202 |
| 4,906,345 A | * | 3/1990 | Gramarossa et al. | 204/202 |
| 5,148,100 A | * | 9/1992 | Sekiba | 198/339.1 |
| 5,513,755 A | * | 5/1996 | Heavilon et al. | 209/2 |

* cited by examiner

*Primary Examiner*—Gene O. Crawford
(74) *Attorney, Agent, or Firm*—Birch, Stewart, Kolasch & Birch, LLP

(57) ABSTRACT

An electrically conductive belt conveyer through which objects transported can be conducted with electric power for electrical test during transportation. Conductive members are built inside the belt and formed a normally open circuit. As an object being placed on the belt, the object, the conductive members and a power supply form a closed circuit. The belt conveyer is less expensive than a conventional chain conveyor for electrical test.

6 Claims, 3 Drawing Sheets

BELT CONVEYER WITH POWER CONDUCTION FOR ELECTRICAL TEST

BACKGROUND OF THE INVENTION

1. Field of the Invention

The invention generally relates to a belt conveyer for transporting objects, and particularly relates to a belt conveyer on which at least an object can be conducted with electric power for electrical test during transportation.

2. Related Art

In order to save manpower of transporting objects in a workshop, some transportation apparatuses, such as elevators or conveyers, are generally applied.

Conveyers are mainly of belt conveyers and chain conveyers. The cost of a belt conveyer is usually less than a chain conveyer. Since the belt is usually made of rubber, it is electrically insulative, while the chain is made of metal and is electrically conductive.

As chain conveyers are electrically conductive, they are usually applied for transporting objects that require electrical inspection during transportation. The objects are manually set up and formed power loops with the chains for performing electrical tests of the objects. In order words, conventional electrical testing device based on conveyer are made with chain conveyers. However chain conveyers cost more. There are also some limitations for applying chain conveyers in object test: firstly, the work time for each object should be equal; secondly, the positioning lever for the electric power terminal should be adjusted individually if the objects are not placed in a same distance; and thirdly, different electric power terminals have to be prepared for different objects.

In order to solve the aforesaid problems, the invention provides an electrically conductive belt conveyer through which objects transported can be tested with electric power. The belt conveyer is less expensive. Objects on the belt do not require a same work time of test or assembly. The electric power terminal does not require individual positioning adjustments for different distances of objects. And, a same power terminal can be applied for different objects.

SUMMARY OF THE INVENTION

The primary objective of the invention is to provide an electrically conductive belt conveyer that is less expensive.

The secondary objective of the invention is to provide an electrically conductive belt conveyer that is replaceable from conventional belt and costs less.

Another objective of the invention is to provide an electrically conductive belt conveyer that does not need adjustment of positioning of power terminals when distance between objects is changed.

Yet another objective of the invention is to provide an electrically conductive belt conveyer that does not need changing of power terminal when handling different kinds of object.

An electrically conductive belt conveyer according to the invention includes a roller platform and a belt. The roller platform includes a supporting frame and two rollers mounted on two ends of the supporting frame. The belt surrounds the two rollers for rotation and transporting objects placed thereon. Power conductive members are built inside the belt and formed a normally open circuit. As an object being placed on the belt, the object, the conductive members and a power supply form a closed circuit so that the object is tested with electric power. The electrically conductive belt conveyer of the invention is capable of performing electrical test of object with less cost.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
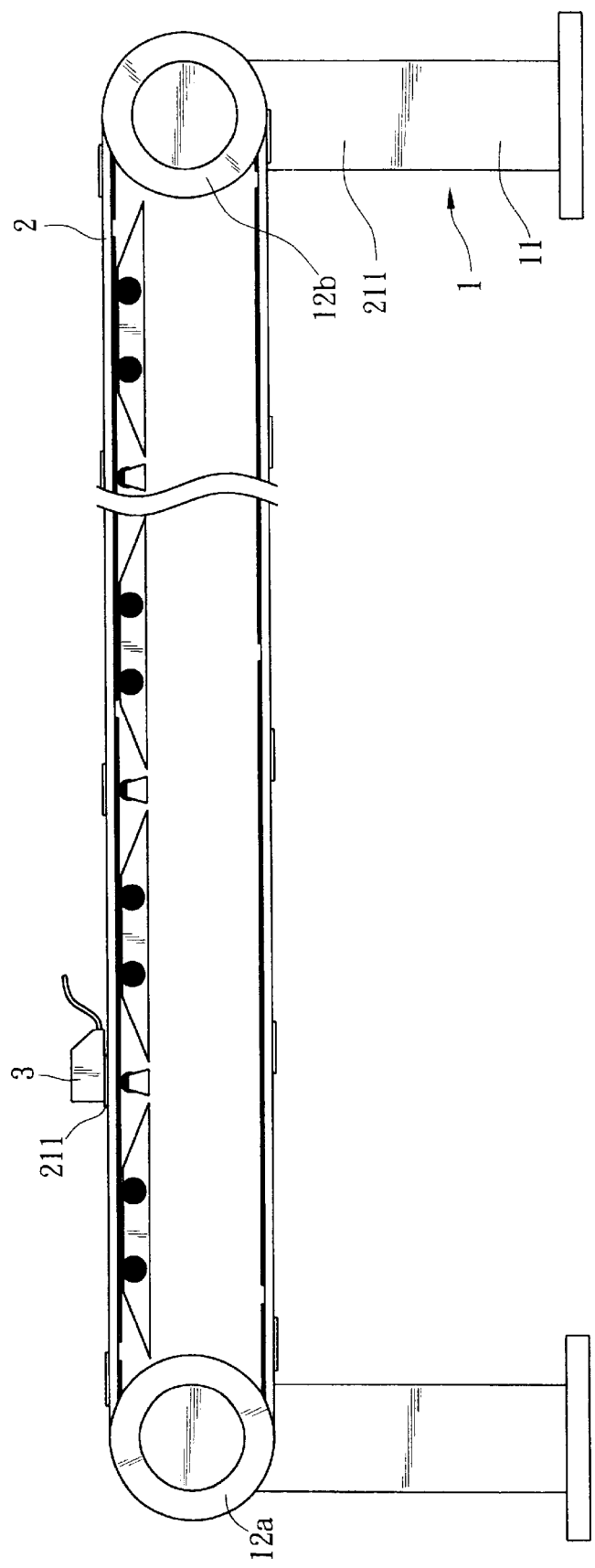
FIG. 1 is a sectional view of an electrically conductive belt conveyer of the invention.
Figure 2:
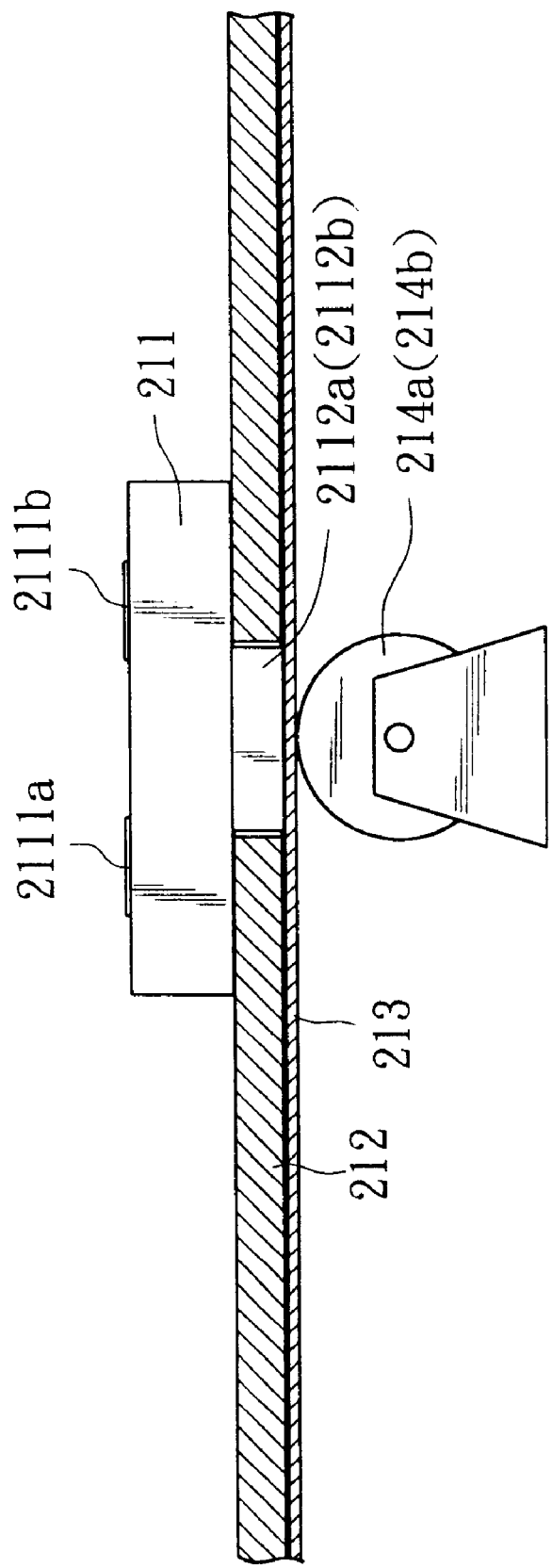
FIG. 2 is a sectional view of a belt in an embodiment of the invention.
Figure 3:
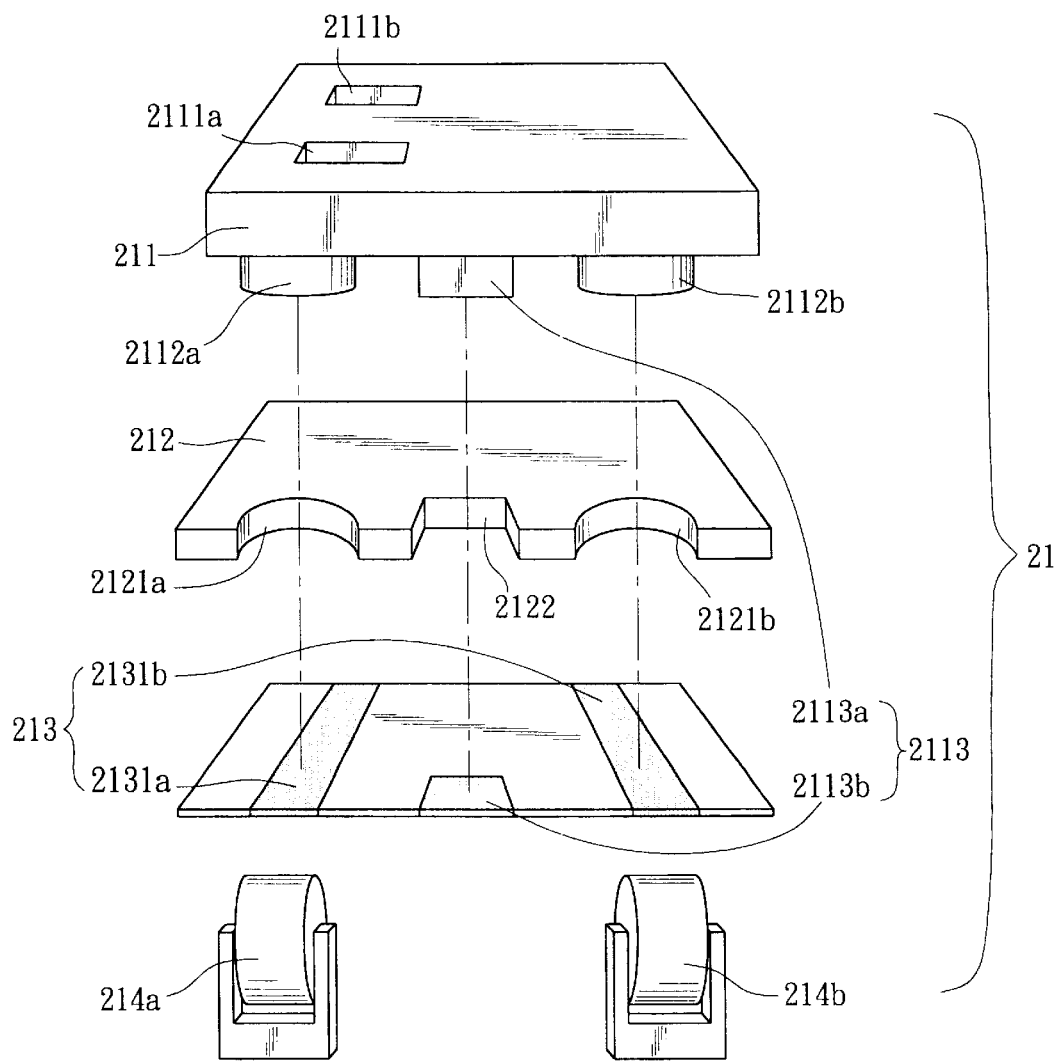
FIG. 3 is a detailed sectional view of conductive members in an embodiment of the invention.

As shown in FIGS. 1, 2 and 3, an electrically conductive belt conveyer according to the invention includes a roller platform 1 and a belt 2. The roller platform 1 includes a supporting frame 11 and two rollers 12a, 12b. The supporting frame 11 supports the roller platform 1, the belt 2 and other components. The rollers 12a, 12b are mounted on two ends of the supporting frame 11 and driven by a driver (not shown in the drawings).

The belt 2 surrounds the rollers 12a and 12b. There are conductive members 21 formed on the belt 2. The conductive members 21 connect to an unshown power supply so that an electric power circuit is formed when an object is placed on the belt 2 and connected to a conductive member, and the electrical function of the object is tested under power supply. The electric power circuit is open when there is no object placed on the belt 2.

The conductive members 21, as shown in FIGS. 2 and 3, include at least a detachable power terminal 211, a belt layer 212, a conductive layer 213 and conductive wheels 214a, 214b. The power terminal 211 is removably attached to the belt 2. Each power terminal 211 is formed with two openings 2111a, 2111b spaced apart for receiving power plugs of an object. Two conductive plates 2112a, 2112b are fixed to the openings 2111a, 2111b respectively for electric connection with the object and conductively touch the conductive layer 213 of the belt 2. A fastener 2113 is formed between the power terminal 211 and the conductive layer 213. The fastener 2113, for example, includes a magnet 2113a and a ferric plate 2113b fixed to the power terminal 211 and the conductive layer 213 respectively so that the power terminal 211 can be fastened to the belt 2 by a magnetic force.

The belt layer 212 of the belt 2 is formed with through holes 2121a, 2121b and 2122 for the conductive plates 2112a, 2112b and the magnet 2113a passing through. The conductive layer 213 includes two conductive strips 2131a, 2131b for transferring electric power to the conductive plates 211a, 211b. The power source for the power terminal 211 is conducted from the conductive wheels 214a, 214b, via the conductive strips 2131a, 2131b, to the conductive plates 2112a, 2112b, and finally provided to the object plugged in the openings 2111a, 2111b.

As a result, when objects 3 being transferred by the belt conveyer in which the belt 2 is moving along the platform 1 and the rollers 12a, 12b, electric power is provided to the objects via the power terminals 211 attached to the belt 2. Therefore, the objects can be tested with electric power. By means of the belt conveyor, the cost of testing electrical function of objects is much inexpensive than that with conventional chain conveyers.

The electrically conductive belt conveyor of the invention has the following advantages:

1) The belt conveyor for testing electrical function of objects during transportation is much inexpensive than conventional devices, usually only one fifth of a chain conveyer.

2) The conventional belt conveyer can be replaced with a belt of the invention for performing electrical test so as to save cost of the device.

3) The belt conveyer is not limited to the following shortages of chain conveyers: the work time for each object should be equal; the positioning lever for the electric power terminal should be adjusted individually if the objects are not in a same distance; and different electric power terminals have to be prepared for different objects.

4) The power terminal in the invention can be easily modified for testing different objects.

5) There is a high flexibility that the invention can be applied to only a portion of a production line, and can be easily rearranged for different portions of the line.

6) The invention is applicable to the whole production line or only a part of the line.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrically conductive belt conveyer, comprising:
   a roller platform, having a supporting frame and two rollers mounted on two ends of said supporting frame; and
   a belt, surrounding said two rollers, having conductive members formed thereon for providing a power supply, said conductive members comprise:
   a power terminal, having two openings spaced apart for receiving power plugs of an object, and two conductive plates fixed to said openings respectively for electrical connection with said object; and
   two conductive wheels, corresponding to said conductive plates, for conducting electric to said conductive plates.

2. An electrically conductive belt conveyer according to claim 1 further comprises a driver for driving said rollers and said belt.

3. An electrically conductive belt conveyer according to claim 1 wherein said power terminal further comprises a fastener for fastening said power terminal to said belt, said conductive members further comprise:
   a belt layer, adjacent to said conductive plates, and formed with two through holes for said conductive plates passing through; and
   a conductive layer, adjacent to said belt layer, formed with two conductive strips for electrical connection among said conductive wheels and said conductive plates that pass through said through holes.

4. An electrically conductive belt conveyer according to claim 3 wherein said fastener comprises a magnet and a ferric plate fixed to said power terminal and said conductive layer respectively, said belt layer is formed with a through hole for said magnet passing through and fastened with said ferric plate.

5. An electrically conductive belt for a belt conveyer comprising conductive members formed thereon, said conductive members comprise:
   a power terminal, having two openings spaced apart for receiving power plugs of a object to provide electric power, and two conductive plates fixed to said openings respectively for electrical connection with said object; and
   two conductive wheels, corresponding to said conductive plates, for conducting electric to said conductive plates.

6. An electrically conductive belt for a belt conveyer according to claim 5 wherein said conductive members further comprise:
   a belt layer, adjacent to said conductive plates, and formed with two through holes for said conductive plates passing through; and
   a conductive layer, adjacent to said belt layer, formed with two conductive strips for electrical connection among said conductive wheels and said conductive plates that pass through said through holes.

* * * * *